United States Patent [19]
Holoubek et al.

[11] Patent Number: 5,590,418
[45] Date of Patent: Dec. 31, 1996

[54] METHOD AND APPARATUS FOR STABILIZING THE GAIN OF A CONTROL LOOP IN A COMMUNICATION DEVICE

[75] Inventors: Kevin J. Holoubek, Buffalo Grove; Richard J. Keniuk, Cary; Paul R. Bontrager, Woodstock, all of Ill.

[73] Assignee: Motorola, Inc., Schaumburg, Ill.

[21] Appl. No.: 129,276

[22] Filed: Sep. 30, 1993

[51] Int. Cl.$^6$ ............................................. H04B 1/04
[52] U.S. Cl. ........................... 455/126; 455/116; 375/297
[58] Field of Search ....................... 455/234.1, 234.2, 455/241.1, 246.1, 247.1, 249.1, 126, 116, 200.1, 266, 235.1, 240.1, 239.1, 251.1, 254; 375/98; 370/95.3

[56] References Cited

U.S. PATENT DOCUMENTS

| | | | |
|---|---|---|---|
| 4,403,255 | 9/1983 | Schiff | 358/186 |
| 4,502,021 | 2/1985 | Hill et al. | 330/279 |
| 4,625,240 | 11/1986 | Yablovski et al. | 358/143 |
| 4,775,988 | 10/1988 | Chevillat et al. | 375/98 |
| 4,829,593 | 5/1989 | Hara | 375/345 |
| 4,910,467 | 3/1990 | Leitch | 329/306 |
| 5,179,353 | 1/1993 | Miyake | 330/129 |
| 5,187,809 | 2/1993 | Rich et al. | 455/33.1 |
| 5,196,806 | 3/1993 | Ichihara | 375/297 |
| 5,276,921 | 1/1994 | Kosugi | 455/126 |
| 5,303,394 | 4/1994 | Hrncirik | 455/126 |
| 5,304,947 | 4/1994 | Carlsson | 455/126 |
| 5,323,329 | 6/1994 | Keane | 455/126 |
| 5,339,454 | 8/1994 | Kuo et al. | 455/266 |
| 5,361,395 | 11/1994 | Yamamoto | 375/345 |

FOREIGN PATENT DOCUMENTS

0407135A2 9/1991 European Pat. Off. .

Primary Examiner—Edward F. Urban
Attorney, Agent, or Firm—Richard A. Sonnentag

[57] ABSTRACT

A gain stabilization loop performs discrete time adjustments to the RF amplifier forward gain path of a closed-loop transmitter power control system based on a measurement of the gain in the control loop. The stabilization of the RF amplifier gain allows the transmitter's control loop to remain functional over varying gain Conditions which are prevalent within stages of the RF amplifier gain path. The effects of gain changes within the stages due to part-to-part variations. and temperature effects are minimized or eliminated by this gain trimming.

7 Claims, 4 Drawing Sheets

METHOD AND APPARATUS FOR STABILIZING THE GAIN OF A CONTROL LOOP IN A COMMUNICATION DEVICE

FIELD OF THE INVENTION

The present invention relates generally to communication devices and more particularly to stabilization of the gain of a control loop utilized within such communication devices.

BACKGROUND OF THE INVENTION

Use of control loops in communication devices are well known in the art. However, in a time division multiple access (TDMA) communication system where such a communication device may be employed, new problems with conventional control loops arise. For example, when the communication device is a transmitter in the TDMA system, the RF output of the transmitter must be gated "on" and "off." In addition, the power must be "ramped" up and down following a precise envelope shape in order to minimize the spurious output due to the gating of the RF power. The total time, including the ramp-down, off-time, and ramp-up, may only be on the order of tens of microseconds while the amplitude difference between the maximum and minimum output power may be greater than 40 dB. When a closed-loop RF power control system is implemented to accurately track an ideal reference waveform, the required-control loop must have both a broad bandwidth and large dynamic range. Practical considerations in the design of a transmitter with such a control loop recognizes that temperature and part-to-part tolerances degrade the control loop's ability to track the reference signal. Gain variation at the numerous RF stages within the transmitter also contribute to the degradation of the control loop's ability to track the reference signal.

Another problem with the simple first order control loop is that the bandwidth is easily affected by the gain in the many RF and baseband amplifier stages included in the control loop. In order to support the high bandwidth of the reference signal, the closed-loop bandwidth must be carefully controlled. As the amplifier gain or the RF input drive level changes, the closed-loop bandwidth changes, which in turn may cause the system to distort the RF envelope or become unstable.

The power control loop also may have problems handling the different gains that occur when each new transmitter is assembled with different parts. When the gain in the loop increases, the closed-loop bandwidth increases as well. This problem occurs where bandwidths of the individual elements of the loop (RF gain control device and detector bandwidth) will limit the maximum closed-loop bandwidth that the loop can support without becoming unstable. Design constraints of the detector (dynamic range versus detector open-loop bandwidth) tend to set the open-loop bandwidth of the system.

Thus a need exists for a control loop for use in a communication device which provides adequate loop performance in spite of, inter alia, temperature, part-to-part tolerances and gain variations at different stages of the communication device.

DETAILED DESCRIPTION OF A PREFERRED EMBODIMENT

A gain stabilization loop performs discrete time adjustments to the RF amplifier gain path of a closed-loop transmitter power control system based on a measurement of the gain in the control loop. The stabilization of the RF amplifier gain allows the transmitter's control loop to remain functional over varying gain conditions which are prevalent within stages of the RF amplifier gain path. Gain changes within the stages due to part-to-part variations and temperature effects are minimized or eliminated by this gain trimming.

Figure 1:
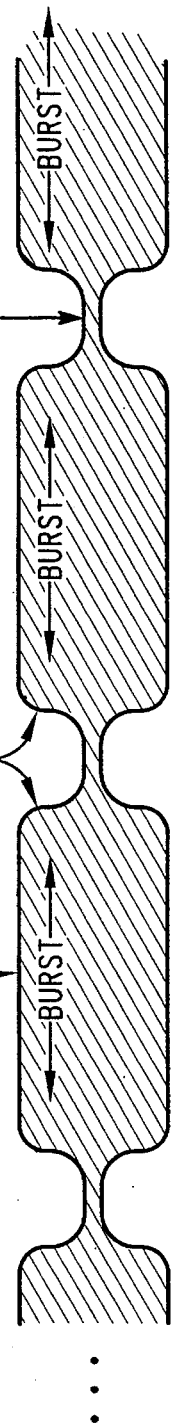
FIG. 1 generally depicts a typical pulsed RF envelope in a TDMA transmitter.

FIG. 1 generally depicts a typical pulsed RF envelope 100 in a TDMA transmitter. The pulsed RF envelope has both dynamic and steady-state portions in the shape. The RF envelope amplitude (output power) is held constant while communication data is sent during maximum amplitude portions of the burst. During the minimum amplitude portion of the burst, the transmitter may be adjusted for a new maximum power or carrier frequency. The bursted RF envelope of a TDMA transmitter as shown in FIG. 1 is an ideal implementation of the discrete-time gain stabilization loop in accordance with the invention.

Figure 2:
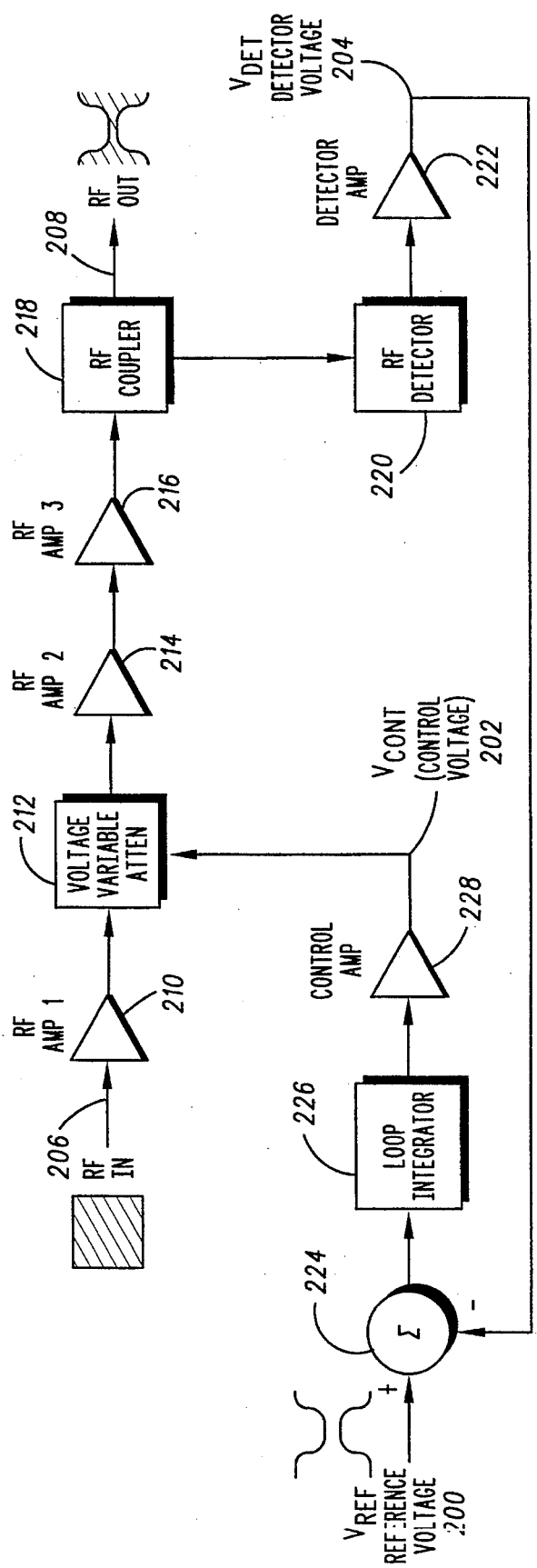
FIG. 2 generally illustrates, in block diagram form, a prior art control loop typically utilized for transmitter control.

FIG. 2 generally illustrates, in block diagram form, a prior art analog control loop typically utilized for transmitter control. In this circuitry, signals $V_{ref}$ 200, $V_{cont}$ 202 and $V_{det}$ 204 are baseband signals. $RF_{in}$ 206 and $RF_{out}$ 208 are represented as the peak voltage amplitude of the RF envelope. A reference signal, $V_{ref}$ 200, with a high bandwidth (on the order of a few hundred kilohertz) controls the envelope amplitude of signal $RF_{out}$. The baseband-to-RF conversion of the amplitude control voltage occurs in a voltage variable attenuator (VVA) 212 in the RF amplifier gain path that has a linear voltage gain transfer function. The RF VVA gain is a multiple of a gain constant for the VVA and the control voltage ($RF_{gain} = G_{VVA} \times V_{cont}$ 202). RF amplifiers 214 and 216, between VVA 212 and RF coupler 218, are linear and the RF-to-baseband conversion of the detector also has a linear response. The voltage output from detector amp 222 is a multiple of the gain of coupler 218, the gain of RF detector 220, the gain of detector amp 222 and the peak amplitude of the envelope of the signal $RF_{out}$ 208 ($V_{det}$ 204 = $G_{coupler} \times G_{detector} \times G_{det\ amp} \times RF_{out}$ 208). The choice of reciprocal transfer functions at the baseband-to-RF and RF-to-baseband conversion points allow the control loop to maintain constant loop gain over a large dynamic range.

The envelope of signal $RF_{out}$ 208 can be derived as a function of the amplitude of signal $RF_{in}$ 206 and the voltage of $V_{cont}$ 202, and is given by:

$$RF_{out} = V cont (G_{Amp1} G_{VVA} G_{Amp2} G_{Amp3}) RF_{in} \qquad (1)$$

where $G_{Amp1}$, $G_{VVA}$, $G_{Amp2}$ and $G_{Amp3}$ are the gains of RF Amp 1 210, VVA 212, RF Amp 2 and RF Amp 3 respectively.

Assuming the gain of RF coupler 218 only affects the detector (which is valid since signal $RF_{out}$ passes through RF coupler 218 with virtually no attenuation), voltage $V_{det}$ and voltage $V_{cont}$ can be written as:

$$V_{det} = G_{coupler} G_{detector} G_{det\ amp} RF_{out} \quad (2)$$

$$V_{cont} = \tfrac{1}{s} G_{cont\ amp}(V_{ref} - G_{coupler} G_{detector} G_{det\ amp} RF_{out}) \quad (3)$$

where $1/s$ is the Laplace Transform of loop integrator 226 as those skilled in the art will appreciate. Loop integrator 226 and control amp 228 generate a first signal, Vcont 202, which is utilized for controlling the control loop itself via VVA 212. Substituting the expression for Vcont of equation (3) into equation (1) yields the solution for the entire closed-loop control system:

$$\frac{RF_{out}}{V_{ref}} = \frac{G_{Amp1} G_{VVA} G_{Amp2} G_{Amp3} G_{cont\ amp} RF_{in}}{s + (G_{Amp1} G_{VVA} G_{Amp2} G_{Amp3} G_{cont\ amp} RF_{in} G_{coupler} G_{detector} G_{det\ amp})} \quad (4)$$

The denominator of equation (4) shows the closed-loop bandwidth of the control loop as a function of the gains of every amplifier in the system, and also the RF input drive level, $RF_{in}$.

The coupler and detector gains can be simplified into reverse path gains by:

$$G_{reverse\ path} = G_{coupler} G_{detector} G_{det\ amp} \quad (5)$$

while the RF and control amplifier gains, and the gain constant of VVA 212 are considered forward path gains, yielding:

$$G_{forward\ path} = G_{Amp1} G_{VVA} G_{Amp2} G_{Amp3} G_{cont\ amp} \quad (6)$$

which simplifies equation (4) for the closed-loop transfer function to:

$$\frac{RF_{out}}{V_{ref}} = \frac{G_{forward\ path} RF_{in}}{s + (G_{forward\ path} RF_{in} G_{reverse\ path})} \quad (7)$$

This is a simple first order control loop. The steady-state output of the control loop is only a function of the reverse path gains. The gain and offset voltage of coupler 218 and detector 220 are carefully designed to be temperature stable. This allows $V_{ref}$ 200 to accurately control the absolute amplitude of $RF_{out}$ 208 when the system is in steady-state conditions.

As previously stated, gain changes within the elements of the transmitter due to temperature and part tolerance presents the majority of problems in transmitter design. The closed-loop bandwidth sensitivity to gain changes in the forward path follows the function $$\Delta BW_{loop} = 10(\Delta G_{forward\ path\ [dB]}/20) \quad (8)$$

In the design of a transmitter with many RF stages, $\Delta G$ in equation (8) may be 20 to 30 dB due to the combination of part-to-part variations and temperature effects. This means the closed-loop bandwidth will change by 10 times or more in the first order control system. This is the major cause of distortion of the RF envelope and/or instabilities within the control loop itself.

Figure 3:
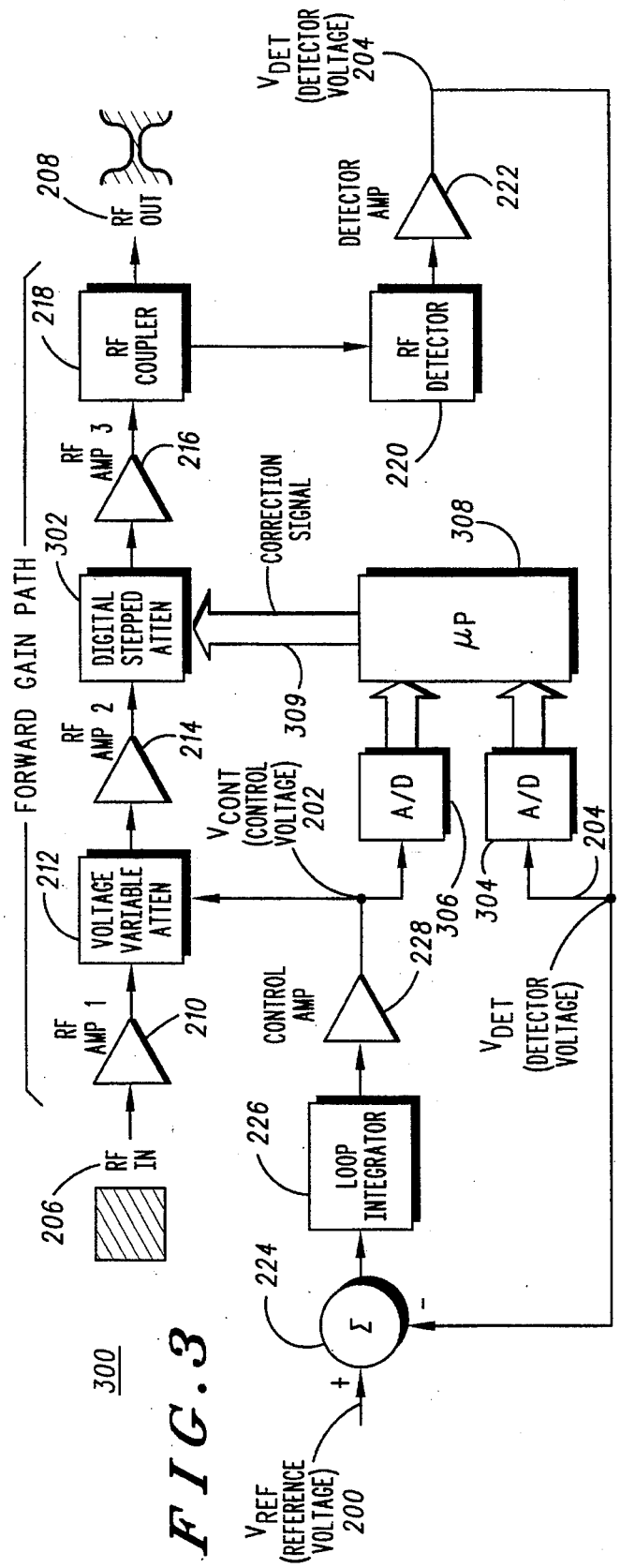
FIG. 3 generally depicts, in block diagram form, stabilization of the gain of a control loop in accordance with the invention.

FIG. 3 generally depicts, in block diagram form, stabilization of the gain of a control loop in accordance with the invention. In the preferred embodiment, the loop monitors a characteristic related to the gain control of the analog control loop and adjusts the gain of the forward path accordingly based on the monitored characteristic. The gain stabilization loop depicted in FIG. 3 is implemented in a transmitter 300, and comprises several elements in addition to the first order RF power control loop depicted in FIG. 2. A first analog-to-digital (A/D) converter 306 is utilized to monitor a first signal $V_{cont}$ 202 input to VVA 212 while a second A/D converter 304 is utilized to monitor a second signal $V_{det}$ 204 at the output of RF detector 220. In the preferred embodiment, VVA 212 is an amplifier having ± gain. Microprocessor (μP) 308, which in the preferred embodiment is a Motorola 68HC11 μP, interprets the voltage information from A/D converters 304, 306, and applies an appropriate correction signal to a (variable) digital stepped attenuator (DSA) 302 located in the RF path. DSA 302 is used to oppose gain changes in the forward path amplifiers due to temperature and part-to-part variation within the amplifiers in accordance with the invention.

Equation (7) can be modified by the addition of DSA 302 to yield the following closed-loop transfer function for the system of FIG. 3:

$$\frac{RF_{out}}{V_{ref}} = \frac{G_{forward\ path} G_{DSA} RF_{in}}{s + (G_{forward\ path} G_{DSA} RF_{in} G_{reverse\ path})} \quad (9)$$

The gain stabilization loop maintains $V_{det}$ 204 equivalent to $V_{ref}$ 200 through real-time setting of VVA 212 via voltage $V_{cont}$ 202. In the preferred embodiment, $V_{cont}$ 202 is a first signal utilized to control the primary control loop, and is not utilized in any manner to control the gain of the forward gain path. Likewise in the preferred embodiment, $V_{ref}$ 200 is utilized for reference purposes in the control of the primary control loop. Continuing, the steady-state value of the transfer functions in equations (7) and (9), when evaluated by setting s=0, is unaffected by the addition of DSA 302 as those skilled in the art will appreciate. As gain increases in the forward path, $V_{cont}$ 202 can be seen to decrease relative to $V_{det}$ 204. With gain reductions in the forward path, $V_{cont}$ 202 increases relative to $V_{det}$ 204. In the preferred embodiment, $V_{det}$ 204 is a second signal which is based on the level of a signal $RF_{out}$ 208 detected at the output of the forward gain path. Continuing, $V_{cont}$ 202 and $V_{det}$ 204 are then monitored by μP 308 during a portion of time where the transmitter output power is at its steady-state amplitude. The relationship that is required between $V_{cont}$ 202 and $V_{det}$ 204 for constant loop gain is known to μP 308, and is predetermined. Under nominal conditions, the design of the transmitter depicted in FIG. 3 is simplified if $V_{cont}$ 202 is maintained equivalent to $V_{det}$ 204, but the relationship is open to engineering design choice. Continuing, a comparison of $V_{cont}$ 202 and $V_{det}$ 204 is performed and a correction signal 309 is produced based on the relationship between $V_{cont}$ 202 and $V_{det}$ 204.

Figure 4:
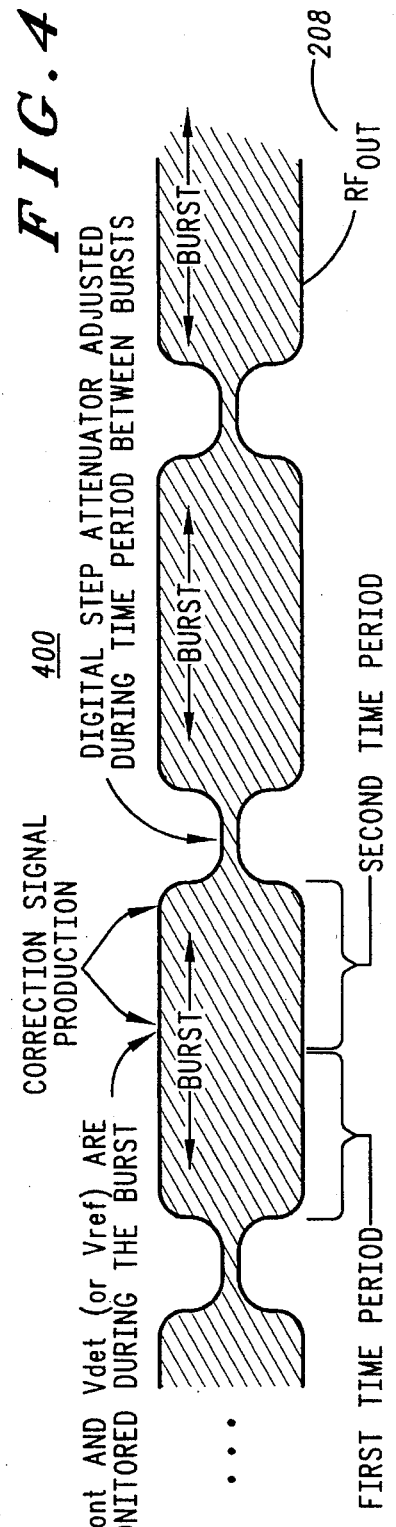
FIG. 4 generally illustrates the timing of gain sampling and attenuator adjustment to perform stabilization of the gain of a control loop in accordance with the invention.

In the preferred embodiment, μP 308 may determine that an adjustment of 10 or more dB is required in a subsequent burst, but this does not occur immediately after the correction signal 309 is produced. FIG. 4 generally illustrates the timing of gain sampling and attenuator adjustment to perform stabilization of the gain of a control loop in accordance with the invention. DSA 302 is not changed during times when the transmitter output power is at maximum (i.e., during the burst); DSA 302 is only adjusted after the transmitter output power is ramped-down during the next minimum RF output period (i.e., during the time period between bursts). In the preferred embodiment, the burst depicted in FIG. 4 may either be a burst of speech information or data information. Continuing, the analog control loop depicted in FIG. 2 controls the RF envelope for the entire burst, except for a tiny discontinuity where DSA 302 is toggled at very low output power between bursts. Important to note is that the response time of the gain stabilization loop is limited to the rate of the burst period.

The range of DSA 302 can be as large as required to encompass the worst case gain changes in the forward path of the transmitter. This allows the analog control loop to operate at optimum loop gain (and optimum bandwidth) with no calibration at all. For example, in the preferred embodiment, at power-up on a new transmitter, the first burst will pass through the analog control loop and μP 308 will determine if the analog loop gain is optimum. If a gain adjustment is required, the new gain setting will be applied to the next burst. By the second burst the loop gain may be within a couple of dB of the optimum gain. Stepped attenuator 302 is adjusted to the closest loop gain within plus or minus the least significant stepsize of attenuator 302 (this may be a 0.5, 1 or 2 dB step depending on the choice of attenuator). For each burst, μP 308 stores this optimum "gain stabilization" value in a table indexed over power and frequency which allows gain changes due to different output powers/carrier frequencies to be handled independently. This table is required for transmitters which support frequency hopping and is updated as the gain changes within the control system. Under nominal conditions, it is desirable to select the path gain such that DSA 302 is typically in the middle of its range.

Figure 5:
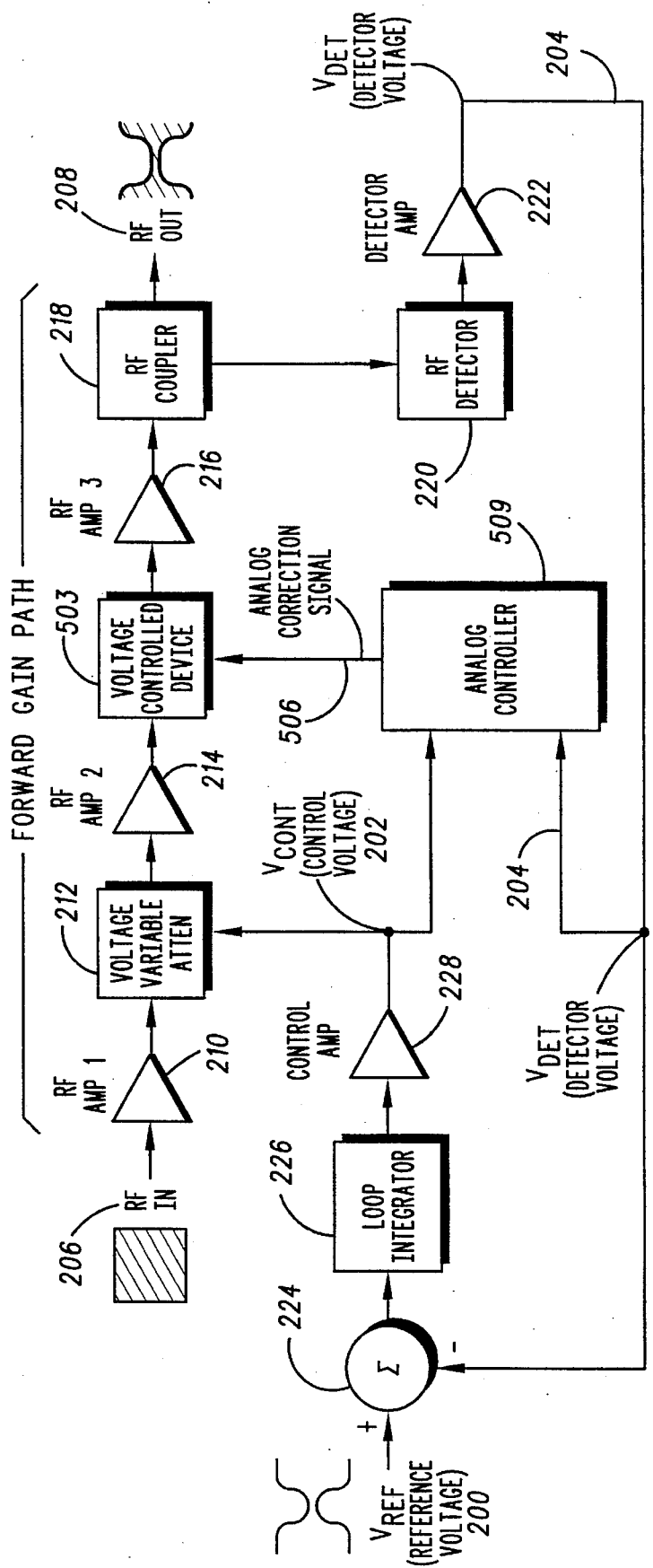
FIG. 5 generally depicts, in block diagram form, an alternate embodiment of stabilization of the gain of a control loop in accordance with the invention.

FIG. 5 generally depicts, in block diagram form, an alternate embodiment of a transmitter 500 to perform stabilization of the gain of a control loop in accordance with the invention. As shown in FIG. 5, A/D converters 304, 306 and μP 308 are replaced with an analog controller 509. In one alternate embodiment, analog controller 509 may be comprised of a summing junction and an integrator. Analog controller 509 and a voltage controlled device 503 (with ± gain) together accomplish the monitoring and gain correction task. The implementation depicted in FIG. 5 would perform the gain stabilization in a continuous fashion versus the discrete implementation depicted in FIG. 3. However, the operation of transmitter 500 is similar to that of transmitter 300 in that analog controller 509 would produce a correction signal 506 which would then be used to adjust voltage controlled device 503.

Those skilled in the art will appreciate that various other implementations of transmitters 300 and 500 are available which would not alter the gain stabilization process in accordance with the invention. For example, since the gain stabilization mechanism is controlling the gain of the loop, it is well understood that the gain correcting element could reside in the forward and/or reverse paths. It is also well understood that under steady state conditions, the signal $V_{ref}$ 200 could be substituted for the second signal, $V_{det}$ 204, in determining the loop gain.

Figure 6:
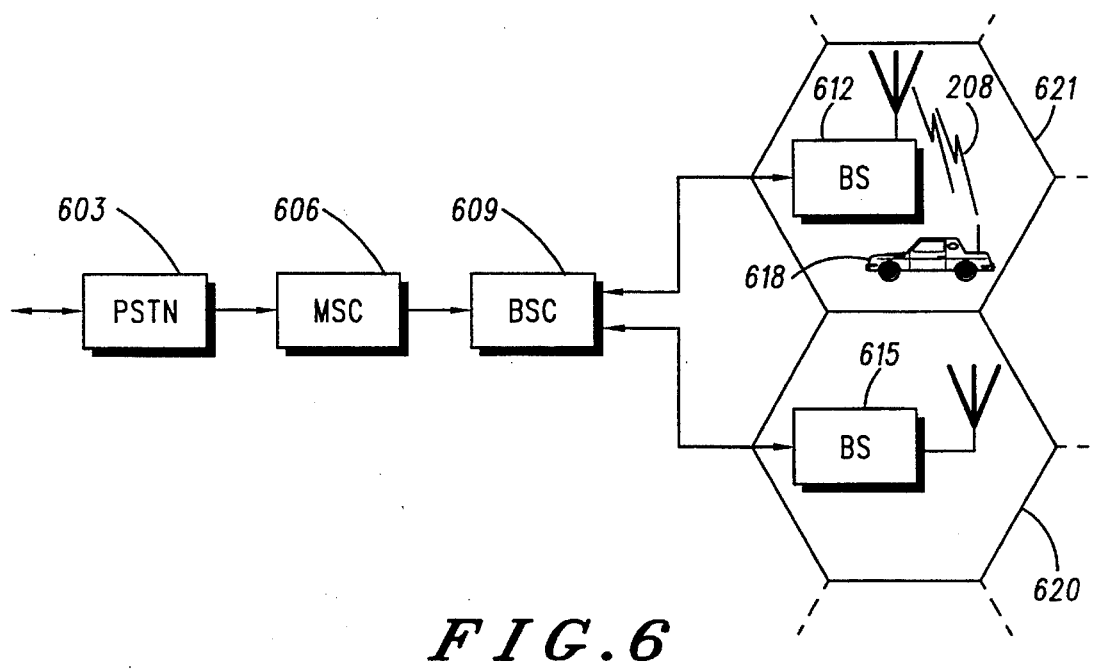
FIG. 6 generally depicts a cellular radiotelephone system which may beneficially employ the present invention.

FIG. 6 generally depicts a cellular radiotelephone system which may beneficially employ the present invention. As depicted in FIG. 6, a Mobile services Switching Center (MSC) 606 is coupled to a Public Switched Telephone Network (PSTN) 603. MSC 606 is also coupled to a Base Station Controller (BSC) 609 which performs switching functions similar to MSC 606, but at a location remote with respect to MSC 606. Coupled to BSC 609 are base-stations (BSs) 612, 615, which in the preferred embodiment, are capable of communicating with mobile stations (MSs) such as MS 618 via signal $RF_{out}$ 208. Transmission of signal $RF_{out}$ 208 from a BS, and for clarity purposes BS 612, occurs on a downlink of a radio channel while communication from MS 618 to BS 612 occurs on an uplink of a radio channel.

Figure 7:
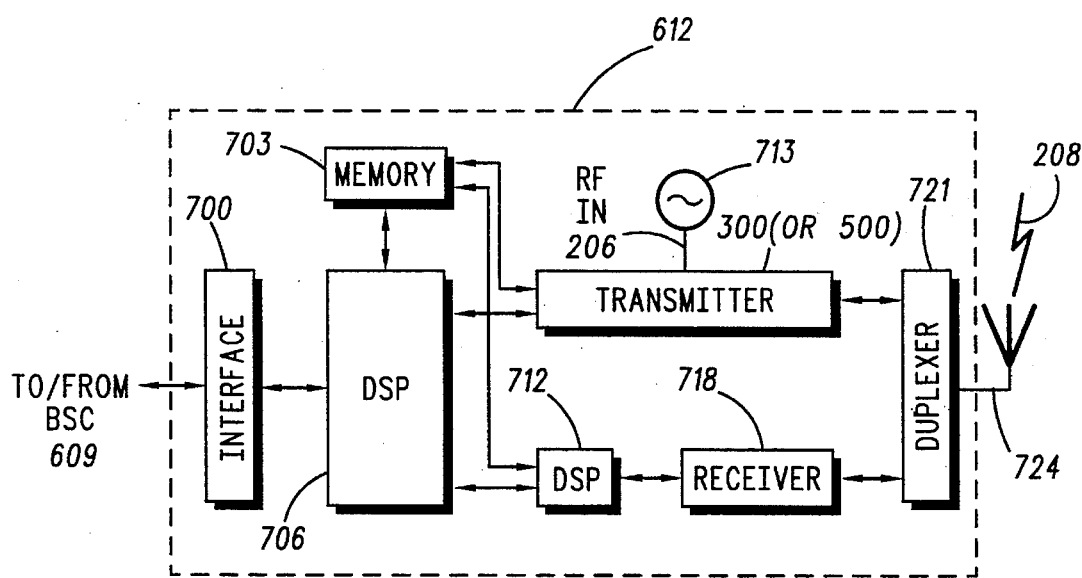
FIG. 7 generally depicts a communication device which may beneficially employ the present invention.

FIG. 7 generally depicts a communication device which may beneficially employ the present invention. As depicted in FIG. 7, the communication device illustrates BS 612, however the communication device of FIG. 7 could substantially illustrate MS 618 with the removal of interface 700. In addition, the block diagram depicted in FIG. 7 also applies to BS 615 depicted in FIG. 6. Continuing, an interface 700, which in the preferred embodiment is a time division multiplexed (TDM) bus interface similar to the one described in U.S. Pat. No. 5,081,641, having as inventors Kotzin et al., and incorporated herein by reference, is coupled to a microprocessor Digital Signal Processor (DSP) 706, which in the preferred embodiment is a Motorola 56000 DSP. Coupled to DSP 706 is memory block 703 and DSP 712 utilized for received signal equalization purposes. DSP 706 is likewise coupled to transmitter 300 (or transmitter 500) which implements the gain stabilization in accordance with the invention. In the preferred embodiment, signal $RF_{out}$ 208 is in a TDM/TDMA format.

While the preferred embodiment in accordance with the invention has been shown to be a transmitter having an analog control loop, the gain stabilization loop circuitry 300 depicted in FIG. 3 may be beneficially employed in any device implementing a control system having strict gain, bandwidth and large dynamic range requirements. For example, the gain stabilization loop circuitry may likewise be beneficially employed in a receiver, such as receiver 718 of FIG. 7, which, for example, implements an automatic gain control (AGC) loop.

While the invention has been particularly shown and described with reference to a particular embodiment, it will be understood by those skilled in the art that various changes in form and details may be made therein without departing from the spirit and scope of the invention.

What we claim is:

1. A method of stabilizing a control loop in a power amplifier, the control loop including a forward gain path and a reverse gain path, the power amplifier being compatible with a time division multiple access (TDMA) communication system and transmitting information via bursts, the method comprising the steps of:

monitoring a control signal input to the forward gain path and a signal produced in the reverse gain path during a first time period of a burst when a power output of the power amplifier is at a steady-state amplitude;

determining the gain of the control loop based on a ratio of the control signal and the signal produced in the reverse gain path, the signal produced in the reverse gain path based on a level of a signal detected at an output of the forward gain path;

producing a correction signal based on the determined gain of the control loop during a second time period when the power output of the power amplifier is at a steady-state amplitude; and adjusting the gain of the control loop during a time period between signal bursts utilizing the correction signal to maintain the desired loop bandwidth.

2. The method of claim 1 wherein the signal produced in the reverse gain path comprises a signal that is based on a level of a signal detected at an output of the forward gain path.

3. A communication device having a control loop that includes a forward gain path and a reverse gain path, the communication device utilized in a time division multiple access (TDMA) communication system and operating on bursts conveyed by the TDMA communications system, the communication device comprising:

means, during a first time period of a burst when a power output of the communication device is at a steady-state amplitude, for monitoring a control signal applied to an input of the forward gain path and utilized for controlling the control loop;

means, during the first time period of the burst when the power output of the communication device is at a steady-state amplitude, for monitoring a signal in the reverse gain path; and means, during a second time period of the burst when the power output of the communication device is at a steady-state amplitude, for producing a correction signal and for adjusting a gain of the control loop during a time period between bursts to maintain a desired loop bandwidth.

4. The communication device of claim 3 wherein the communication device is a transmitter implemented in a base-station or a mobile station of the TDMA communication system.

5. The communication device of claim 3 wherein the communication device is a receiver implemented in either a base-station or a mobile station of the TDMA communication system.

6. The communication device of claim 3 wherein the signal in the reverse gain path comprises a signal that is based on a level of a signal detected at an output of the forward gain path.

7. The communication device of claim 3 wherein the signal in the reverse gain path comprises a signal that is based on a level of a reference signal used to produce the control signal.

* * * * *

UNITED STATES PATENT AND TRADEMARK OFFICE
CERTIFICATE OF CORRECTION

PATENT NO. : 5,590,418
DATED : December 31, 1996
INVENTOR(S) : Holoubek, et al.

It is certified that error appears in the above-indentified patent and that said Letters Patent is hereby corrected as shown below:

On the title page:

Abstract reads "gain Conditions" should be --gain conditions-- and "variations." should be --variations--.

Signed and Sealed this

Seventeenth Day of June, 1997

Attest:

BRUCE LEHMAN

*Attesting Officer*  *Commissioner of Patents and Trademarks*